(12) United States Patent
Ouvrier-Buffet et al.

(10) Patent No.: US 9,065,432 B2
(45) Date of Patent: Jun. 23, 2015

(54) DEVICE FOR PROCESSING A SIGNAL DELIVERED BY A RADIATION DETECTOR

(75) Inventors: Patrice Ouvrier-Buffet, Saint-Jorioz (FR); Andrea Brambilla, Veurey-Voroize (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 1215 days.

(21) Appl. No.: 12/912,995

(22) Filed: Oct. 27, 2010

(65) Prior Publication Data

US 2011/0098980 A1    Apr. 28, 2011

Related U.S. Application Data

(63) Continuation of application No. PCT/EP2010/064569, filed on Sep. 30, 2010.

(30) Foreign Application Priority Data

Oct. 1, 2009  (FR) ............................ 09 56844
Nov. 30, 2009 (FR) ............................ 09 58506

(51) Int. Cl.
*H03K 5/04* (2006.01)
*H03J 5/08* (2006.01)
*G01T 1/17* (2006.01)
*H03K 5/08* (2006.01)

(52) U.S. Cl.
CPC ........ *H03K 5/04* (2013.01); *G01T 1/171* (2013.01); *H03K 5/08* (2013.01)

(58) Field of Classification Search
CPC ............ G01T 1/171; G01T 1/36; H03K 5/04; H03K 5/08; G01R 29/02; H01J 2237/2442

USPC ................. 702/189–191, 193; 356/300; 250/370.09; 378/19
See application file for complete search history.

(56) References Cited

U.S. PATENT DOCUMENTS

| 4,081,676 A * | 3/1978 | Buchnea ..................... 378/46 |
| 7,126,410 B2 | 10/2006 | Rostaing et al. |
| 7,615,753 B2 | 11/2009 | Audebert et al. |

(Continued)

FOREIGN PATENT DOCUMENTS

| EP | 2 071 722 A1 | 6/2009 |
| FR | 2 864 628 A1 | 7/2005 |

OTHER PUBLICATIONS

U.S. Appl. No. 13/535,852, filed Jun. 28, 2012, Brambilla, et al.

(Continued)

*Primary Examiner* — Manuel L Barbee
(74) *Attorney, Agent, or Firm* — Oblon, McClelland, Maier & Neustadt, L.L.P.

(57) ABSTRACT

A device that processes a signal delivered by a radiation detector includes a circuit that delivers a voltage pulse whose amplitude is proportional to a charge detected by the radiation detector. The device also includes an analog to digital converter to digitize the voltage pulse at a given sampling frequency and delivers a corresponding digital signal to a processing circuit. The processing circuit reads the digital signal, computes a temporal variation rate of the digital signal and captures the digital signal when the temporal variation reaches a threshold.

16 Claims, 9 Drawing Sheets

(56) References Cited

U.S. PATENT DOCUMENTS

| | | |
|---|---|---|
| 7,652,242 B2 | 1/2010 | Ouvrier-Buffet et al. |
| 8,527,242 B2 * | 9/2013 | Granot et al. ............... 702/189 |
| 2003/0086523 A1 | 5/2003 | Tashiro et al. |
| 2009/0033913 A1 * | 2/2009 | Mott .............................. 356/51 |

OTHER PUBLICATIONS

French Seach Report and Written Opinion dated Jul. 30, 2010 in corresponding French Application No. 0958506 (with English Translation of Category of Cited Documents).

* cited by examiner

Background

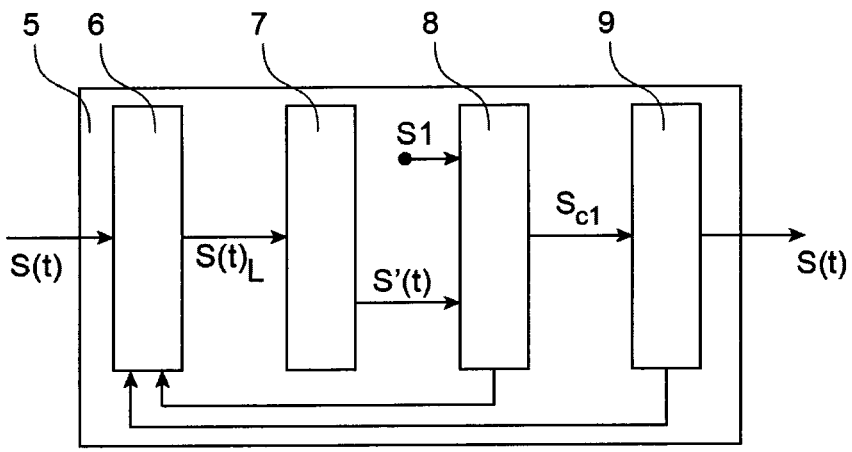
FIG. 12
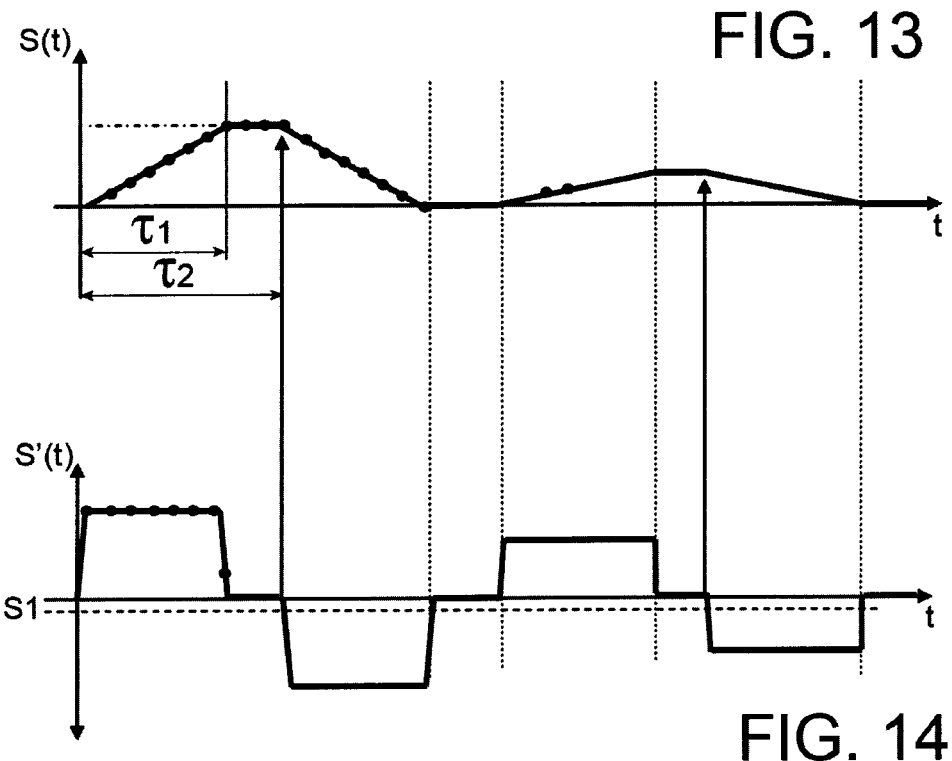
FIG. 13
FIG. 14

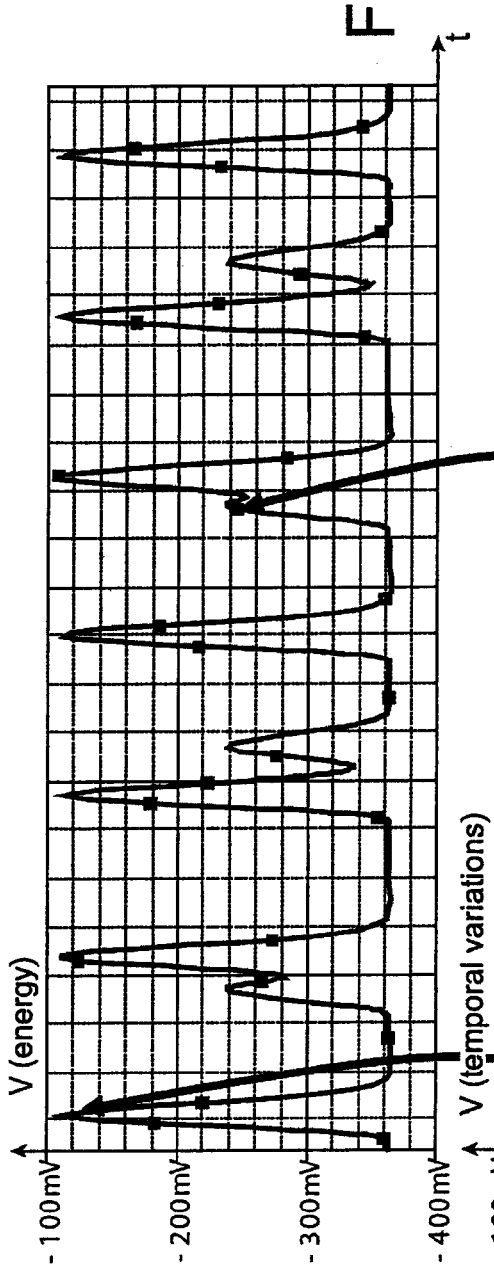
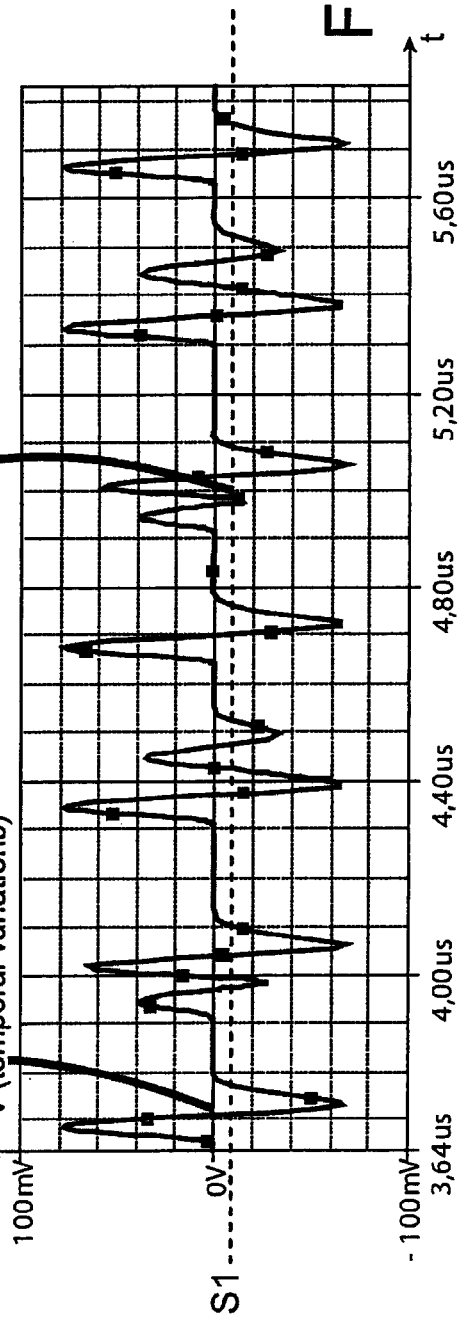

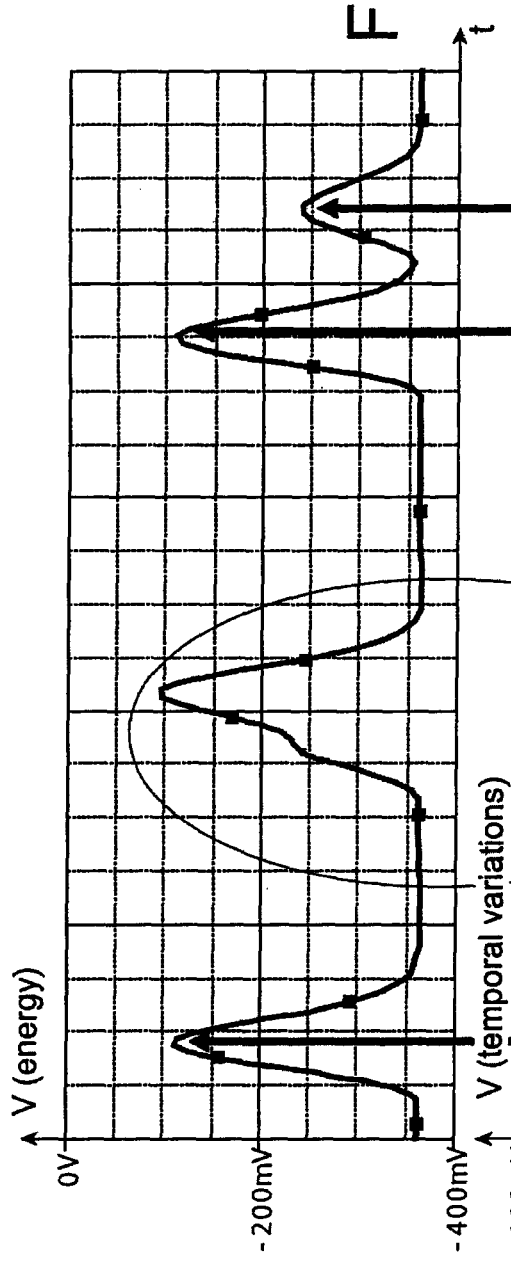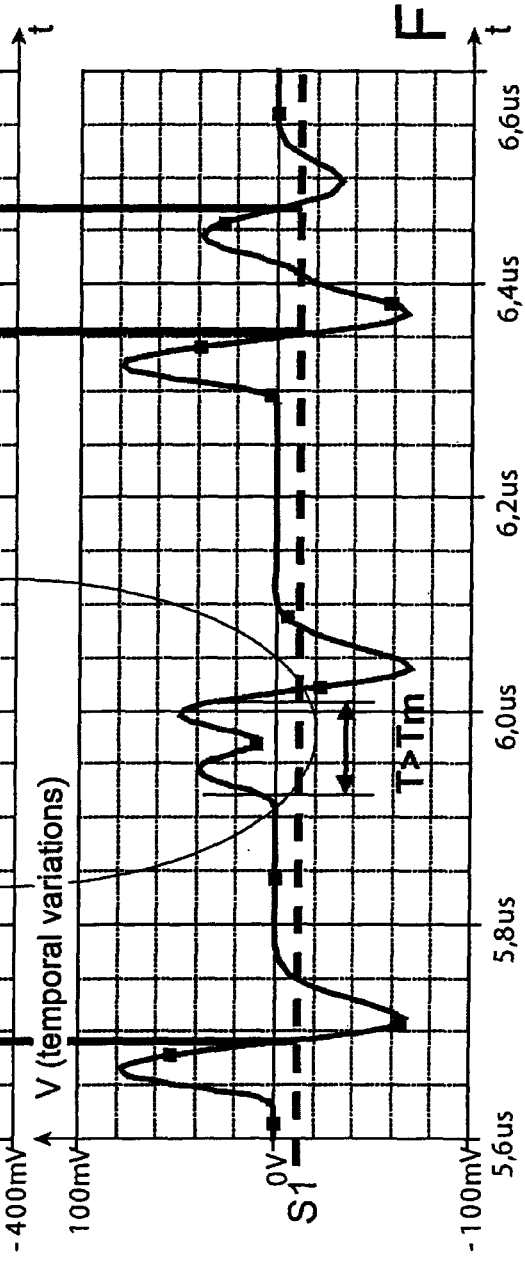
FIG. 17A
FIG. 17B

DEVICE FOR PROCESSING A SIGNAL DELIVERED BY A RADIATION DETECTOR

TECHNICAL FIELD AND BACKGROUND OF THE INVENTION

The invention concerns a device for processing a signal delivered by a radiation detector. The invention also concerns a radiation detecting system that comprises a radiation detector and device for processing the signal delivered by the detector according to the invention.

The invention more particularly concerns the detection at ambient temperature of ionizing electromagnetic radiation (x rays, gamma rays) using semiconductors such as, for example, CdZnTe, CdTe:Cl, CdTe:In.

The use of semiconductors as ionizing electromagnetic radiation detectors has a number of advantages:
- a direct conversion of the electromagnetic radiation into an electric signal [gamma/light/electric charges] when a scintillator is used associated with a photomultiplier),
- detectors operating at ambient temperature, therefore not very bulky, and a high electric signal making it possible to obtain excellent energy resolutions.

For several years, progress relative to the growth of the materials and technology for the detectors as well as progress in electronics and processing of the signal have made it possible to confirm the ambitions of semiconductors in ionizing electromagnetic radiation spectrometry and greatly open their fields of use, namely, for example: 2D imagers for medical imaging with the development of CdZnTe-based scanners, baggage checking systems using x-rays in the security field, nuclear probes for testing irradiated assemblies.

The field of use of the present invention is, more particularly, but not exclusively, that of examining luggage using x-rays, in particular to detect the presence of explosives.

A synoptic schema of an ionizing electromagnetic radiation detection system is symbolically illustrated in FIG. 1. The detection system comprises an ionizing electromagnetic radiation detector 1, an electronic proximity circuit 2 that measures the signal delivered by the detector 1, an electronic processing circuit 3 (filtering, amplifier . . . ) that processes the signal delivered by the electronic circuit 2 and an electronic system 4 that digitizes the signals delivered by the electronic circuit 3 in order to obtain the histogram of those signals.

Electromagnetic radiation spectrometry thus consists of counting and measuring, with the greatest possible precision (energy resolution), the energy of all of the photons making up the electromagnetic radiation and that are absorbed by the detector (detection efficiency).

Depending on the fields of use, the incident electromagnetic radiation is made up of a more or less numerous photon energy spectrum with a very variable energy range (several keV to several MeV). The choice of thickness and surface of a semiconductor detector depends on the detection efficiency and expected sensitivity of the system, respectively. As a non-limiting example, a thickness smaller than a millimeter is sufficient to stop the great majority of the low-energy photons (<100 keV), but, for high-energy photons (>100 keV), a thickness of several millimeters, or even a centimeter, may be necessary.

A significant thickness detector makes it possible to stop a maximum of photons (increasing the interaction probability), but decreases the possible counting rate because the transit time of the charges in the detector is directly proportional to its thickness. A high bias voltage, as well as particular configurations of the detector (irradiation by section), then make it possible to increase the efficiency while maintaining a very low transit time (current pulses<100 ns).

As previously mentioned, an ionizing electromagnetic radiation spectrometry system comprises, aside from the detector 1, an electronic proximity circuit 2, an electronic processing circuit 3 and a digitization circuit 4.

FIG. 2 shows an electronic proximity circuit 2 connected to a detector 1. FIG. 3 shows the current i(t) that is delivered by the detector and enters the electronic circuit 2 and FIG. 4 shows the voltage $V_{OUT}(t)$ delivered by the electronic circuit 2.

The detector 1 comprises a block of semiconductor material M and a resistor R that connects the block M to a high voltage HT. The electronic proximity circuit 2 is a charge preamplifier that comprises a capacitor C1, an amplifier A1, a capacitor C2 and a resistor Rp. The capacitor C1 is mounted at the inlet of the amplifier A1 and the capacitor C2 and the resistor Rp are mounted in series between the inlet and outlet of the amplifier A1.

Upon detection of the interaction of a photon ph, a current i(t) can be collected by an electrode connected to the detector. During the presence time of the detecting current i(t) delivered by the detector 1, the voltage $V_{OUT}(t)$ output from the charge preamplifier is:

$$V_{OUT} = -\frac{1}{C2}\int i\,dt,$$

or $$V_{OUT} = -\frac{Q}{C2}$$

where Q is the quantity of charges emitted by the photon that interacts in the semiconductor material M (cf. temporal zone Za in FIG. 4).

In output from the charge preamplifier, the information corresponding to the energy of the photon is fleeting because the preamplifier unloads. It is therefore necessary to save this voltage as quickly as possible after the detecting current disappears (cf. temporal zone Zb in FIG. 4). In parallel, the relaxation of the charge preamplifier makes it possible to face high counting rates, since the output voltage therefrom accumulates and, without relaxation, the preamplifier would quickly be saturated (cf. the saturation voltage $V_{sat}$ (in FIG. 4)).

The voltage $V_{OUT}(t)$ delivered by the electronic circuit 2 is the input voltage of an electronic processing circuit 3. FIG. 5 shows the voltage Vs (t) delivered by an electronic processing circuit 3 as a function of time.

The electronic processing circuit 3 comprises a band-pass filter that makes it possible to optimize the signal to noise ratio. A number of impulse filters can be used, filters with n derivations and n integrations, Gaussian filters, trapezoidal, triangular, digital, etc. These filters are often matchable and it is possible to adjust the derived and integral times to best adjust the signal to noise ratio in the band of interest. For all of these filters, the aim to be achieved is to have a pulse in their outputs whereof the amplitude is proportional to the energy of the photon that interacts in the detector. It has been noted that impulse filters alter the temporal information corresponding to the duration of the detector current; it is increased by the by-pass and the integration. This effect decreases the admissible counting rate by increasing the pile-ups. It is recalled that the counting rate corresponds to the number of pulses detected at the terminals of the detector per unit of time.

When the counting rate is high, the voltage Vs(t) output from the filter does not have enough time to return to zero, the amplitude of the voltage of the following photon is then wrong.

Another significant drawback of the filter comes from its poor linearity when it is used for detectors that deliver current pulses having large shape variations (thick detectors), this is the ballistic deficit error.

The usual solution to reduce this error consists of filtering with a time constant much higher than the duration of the pulse of the input current, which is obviously in conflict with rapid shaping of the pulses adapted to high counting rates.

FIG. 6 shows a switched integrator able to measure the energy of the detected photons, i.e. the amplitude of the pulses output from the band-pass filter. The integrator comprises a first switch SW1, a resistor Ri, an amplifier AMP, a capacitor Ci and a second switch SW2. The first switch SW1 and the resistor Ri are mounted in series, the resistor Ri being placed at the input of the amplifier AMP. The capacitor Ci and the second switch SW2 are mounted in parallel between the input and output of the amplifier AMP. FIGS. 7 and 8 show, respectively, the signal Vs(t) (output voltage of the filter) that enters the integrator and the signal y(t) that comes out of the integrator. The entering signal Vs (t) has an amplitude Am.

Before the signal Vs(t) from the impulse filter arrives, the switch SW1 is open and the switch SW2 is closed. Once the signal Vs(t) crosses a threshold voltage the switch SW2 opens and the switch SW1 closes. Between moments t0 and t1, the signal Vs(t) is integrated. As of moment T1, threshold passage moment on the pulse edge of the signal Vs(t), the switch SW1 opens. As output from the peak detector, the signal Y(t) has an amplitude proportional to the input pulse (|Y(t)|=k Am), therefore to the energy of the photon.

Between moments t1 to t2, the output signal is kept constant, allowing it to be saved in a data system. As of moment t2, the switch SW2 closes: the detector is reset and the system can process a new photon.

This type of switched integrator is used in rapid spectrometry chains with high counting rates, i.e. in electronic spectrometry circuits adapted to detectors subject to intense radiation and producing numerous pulses per unit of time, or high counting rates. A counting rate is generally considered high beyond some 100,000 photons detected per second (or counts per second). The integrators previously described can be used up to several Megaphotons/s. For even higher counting rates, the use of this type of integrator becomes difficult, in particular due to the switches SW1 and SW2, the response times (switching delay between the command and the analog output) of SW1 and SW2 then no longer allowing a complete integration of the signal Vs(t), thereby causing an error on the measurement of the photon's energy. Moreover, the resistance of the switch SW2 in the transition state occurs during the reset time of the integrator, which also contributes to slowing down the measurement chain.

To be able to correctly conduct measurements by spectrometry when a detector is subjected to high counting rates, another solution exists in the prior art. It involves measuring the energy of the photons using a delay line. FIG. 9 shows a counting system using a delay line. Such a system does not use a filtering circuit and the output of the charge preamplifier 2 here is directly connected to an assembly formed by a delay line Lr, an attenuator Att (gain less than 1), a subtractor D, an amplifier A2 and an analog/digital conversion circuit ADC. The delay line Lr is mounted in series with the attenuator Att and forms a delay and attenuation block whereof a first terminal is connected to the output of the preamplifier and the second terminal is connected to a first input of the subtractor D whereof the second end is directly connected to the output of the preamplifier.

The signal $V_{OUT}(t)$ from the preamplifier is delayed through the delay line Lr, the delay of which is greater than the rise time of the signal $V_{OUT}(t)$. The subtractor D subtracts the delayed and attenuated voltage $V_{OUT}(t)$ from the voltage $V_{OUT}(t)$ and the signal resulting from that subtraction is amplified by the amplifier A2, which then delivers, via the amplifier A2, a pulse E(t) whereof the height is proportional to the pulse produced at the terminals of the detector, i.e. the energy ceded by the photon detected in the detecting material. The digitization done by the analog/digital converter ADC is done continuously, the computer being programmed to pick up energy values above a predetermined energy threshold $E_S$. Once the energy values are picked up, more or less elaborate algorithms calculate the corresponding energy value of the photons. FIG. 10 shows an example of a detected energy curve E(t) as a function of time. The points distributed on the curves E(t) symbolically illustrate the digitization of the signal E (t) that is done by the analog/digital converter ADC.

The emission of the photons obtained with an x-ray generator or a radioactive source is a random emission. It is then necessary to process the coincidences, i.e. the periods of time where numerous photons are emitted in a very short time interval, thereby contributing to a piling up of signals as input of the analog/digital conversion circuit. It is specified that the more intense the radiation to which the detector is subject, the higher the probability of such coincidences.

A number of methods for processing coincidences are known. One of the simplest consists of measuring the width of the pulse (time between two successive threshold crossings) and comparing that value with a reference period. If the pulse is too long, there is a pile-up and the measured energy value is not taken into account and the pulse is rejected. The following photon is then awaited. The processing method has the drawback of not being very efficient, in particular when the counting rate is high, in which case there are many pile-ups; most of the pulses then have a duration exceeding the reference duration and are rejected. Thus, the system's efficiency becomes mediocre, such an efficiency representing a ratio between the number of pulses processed and the number of pulses detected.

Also known from the prior art is a device for processing and digitizing an energy spectrum of an electromagnetic radiation such as the device disclosed in patent application EP 2 071 722 published on Jun. 17, 2009. This device comprises a preamplification circuit, a pulse measuring circuit with delay line, a sampler, a current pulse measuring circuit making the difference between the output signal of the preamplification circuit and a derivative of the output signal of the preamplification circuit, and a discrimination circuit producing a binary signal as a function of the output signal of the current pulse measuring circuit, said binary signal controlling the sampling moments of the sampler. This device makes it possible to correct the detection problems related to the random nature of the sampling and the generation of charges in the ionizing electromagnetic radiation spectrometry detection systems.

BRIEF DESCRIPTION OF THE INVENTION

The invention concerns a device for processing a signal delivered by a radiation detector, the device comprising a first circuit able to deliver a voltage pulse whereof the amplitude is proportional to a charge detected by the detector and an analog/digital converter that digitizes the voltage pulse at a given sampling frequency and delivers a digital signal, characterized in that it comprises, downstream of the analog/digital converter, a processing circuit that comprises:

a reading unit for reading the digital signal delivered by the analog/digital converter, a computing unit that computes a temporal variation rate of the read digital signal, and a capture circuit, controlled by said computing unit, able to capture the read digital signal when the temporal variation rate reaches a predetermined threshold.

According to one particular embodiment, the device of the invention comprises, downstream of the processing circuit, means making it possible to obtain an amplitude spectrum of the signals captured by the capture circuit.

According to one preferred embodiment, the device according to the invention comprises, upstream of the computing unit, a subtraction circuit, able to perform a subtraction of two temporally offset signals.

According to a first alternative, the subtraction circuit is situated upstream of the analog/digital converter, and downstream of the preamplifier connected to the detector. The subtraction circuit generates a signal combining the signal delivered by the preamplifier at a moment t and the signal delivered by the same preamplifier at a moment t−Δt.

The invention also concerns a radiation detecting system that comprises a radiation detector and device for processing the signal delivered by the detector according to the invention.

The object of the present invention is to propose an electronic device that makes it possible, simply and effectively, to measure, from the current pulses from a detector, the energy of the incident photons in a very short time that guarantees a very high counting rate and very great precision.

BRIEF DESCRIPTION OF THE FIGURES

Other features and advantages of the invention will appear upon reading one preferred embodiment done in reference to the appended figures, in which:

FIG. 12 shows a detailed view of a circuit of the detecting device of the invention shown in FIG. 11;

FIGS. 13 and 14 show characteristic electrical signals of the circuit of FIG. 12;

FIGS. 16A and 16B show characteristic electrical signals of the circuit of FIG. 12 that illustrate the operation of the device of the invention in the presence of a number of pile-ons; and FIGS. 17A and 17B show characteristic electrical signals of the circuit of FIG. 12 that illustrate the processing of coincidences and dead times implemented in the device according to the invention.

In all of the figures, same references designate same elements.

DETAILED DESCRIPTION OF PREFERRED EMBODIMENTS OF THE INVENTION

Figure 11:
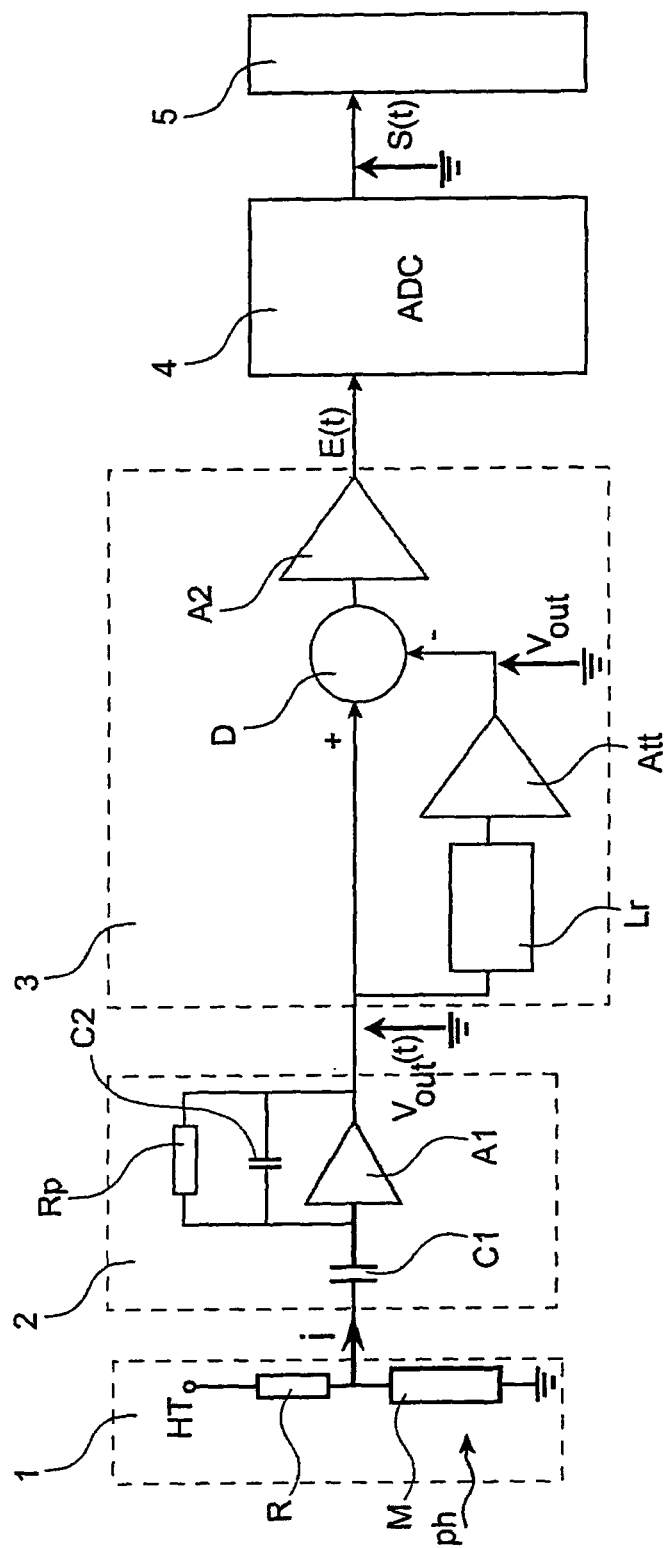
FIG. 11 shows an ionizing electromagnetic radiation spectrometry detecting device according to the preferred embodiment of the invention.

FIG. 11 shows an ionizing electromagnetic radiation spectrometry detecting device according to the preferred embodiment of the invention.

Figure 1:
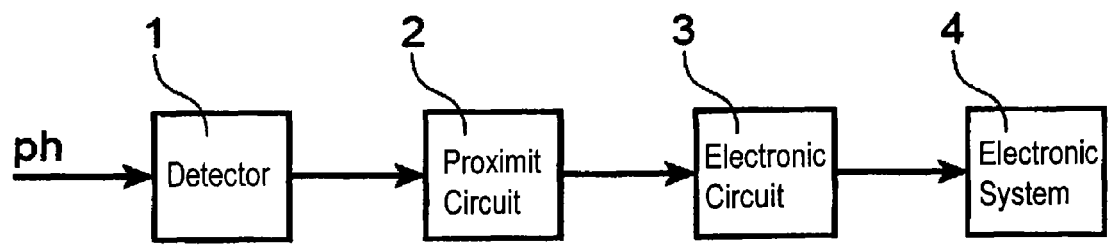
FIG. 1 shows a synoptic schema of a radiation detecting system of the prior art.
Figure 2:
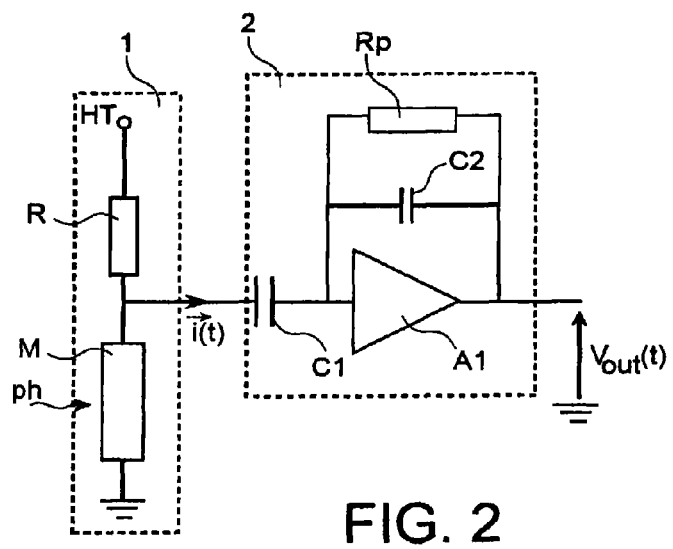
FIG. 2 shows a first electronic circuit that participates in the detecting system of FIG. 1.
Figure 3:
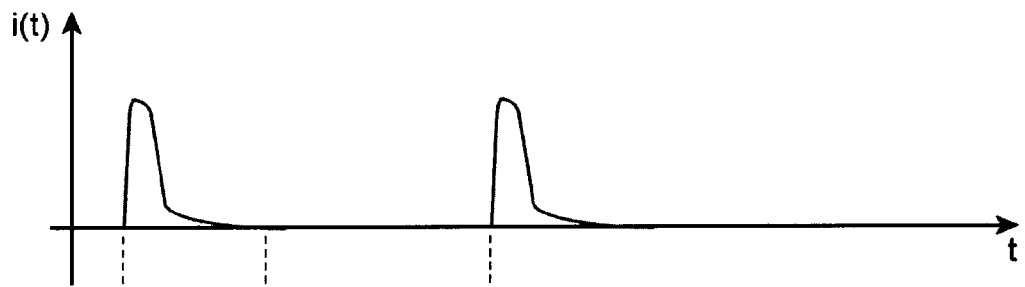
FIGS. 3 and 4 show characteristic electrical quantities of the circuit of FIG. 2.
Figure 4:
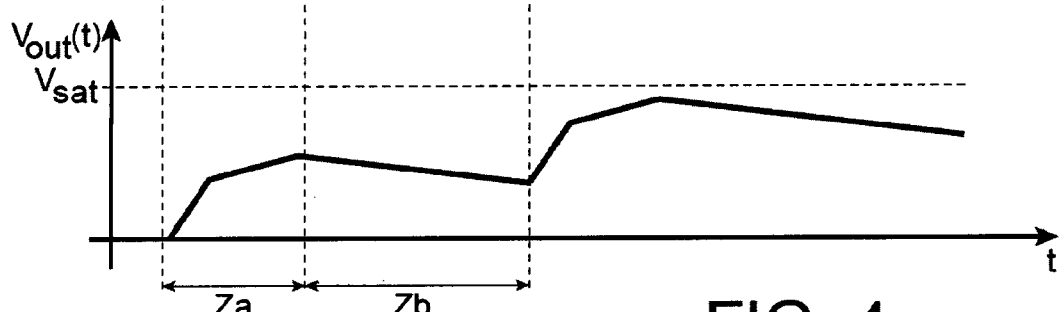
Figure 5:
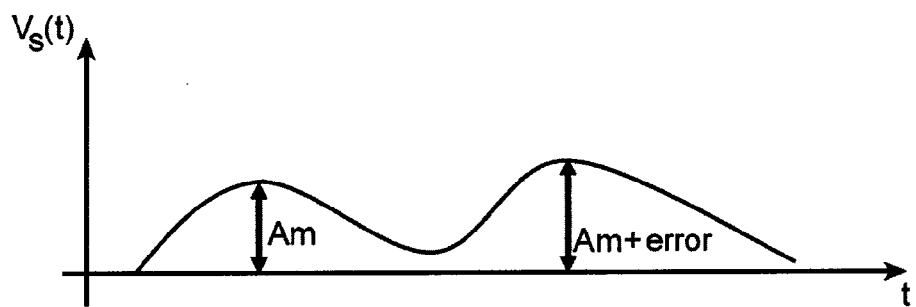
FIG. 5 shows the variation as a function of time of a voltage delivered by an electronic processing circuit that participates in the detecting system of FIG. 1.
Figure 6:
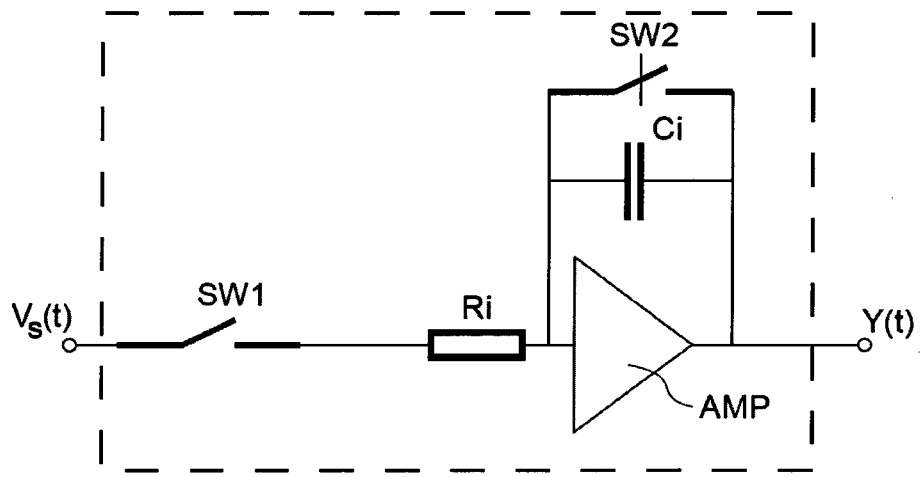
FIG. 6 shows a switched active integrator circuit able to participate in the detecting system of FIG. 1.
Figure 7:
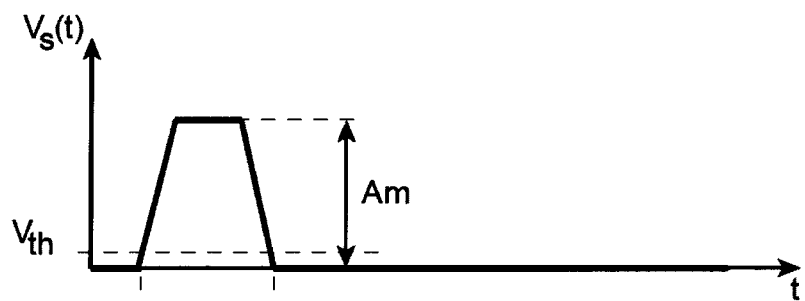
FIGS. 7 and 8 show characteristic electrical signals of the circuit of FIG. 6.
Figure 8:
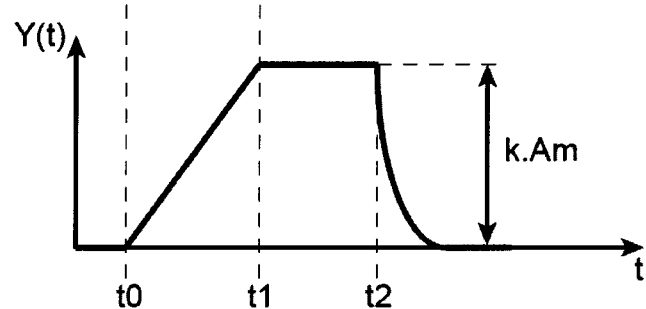
Figure 9:
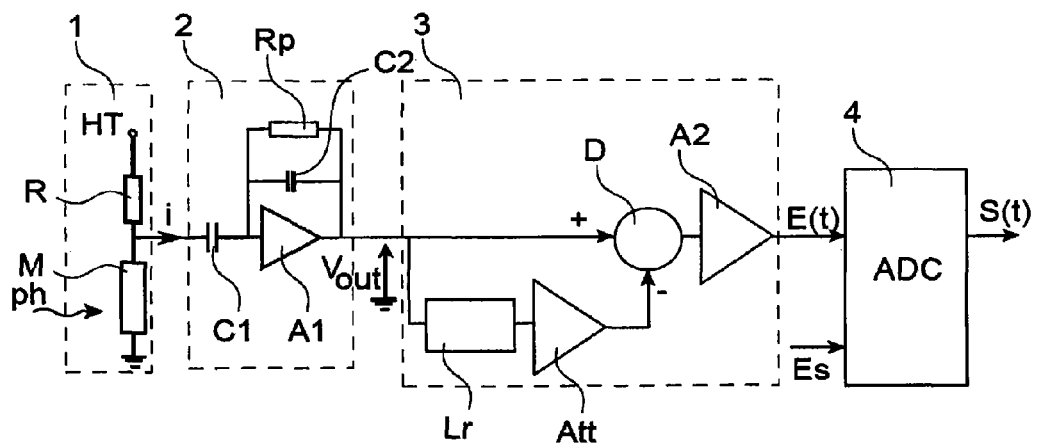
FIG. 9 shows a synoptic schema of a radiation detecting system of the prior art that uses a delay line.
Figure 10:
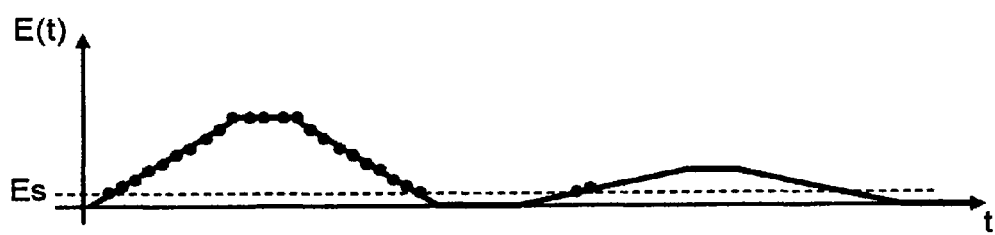
FIG. 10 shows an example of a detected energy curve shown in FIG. 9.
Figure 15:
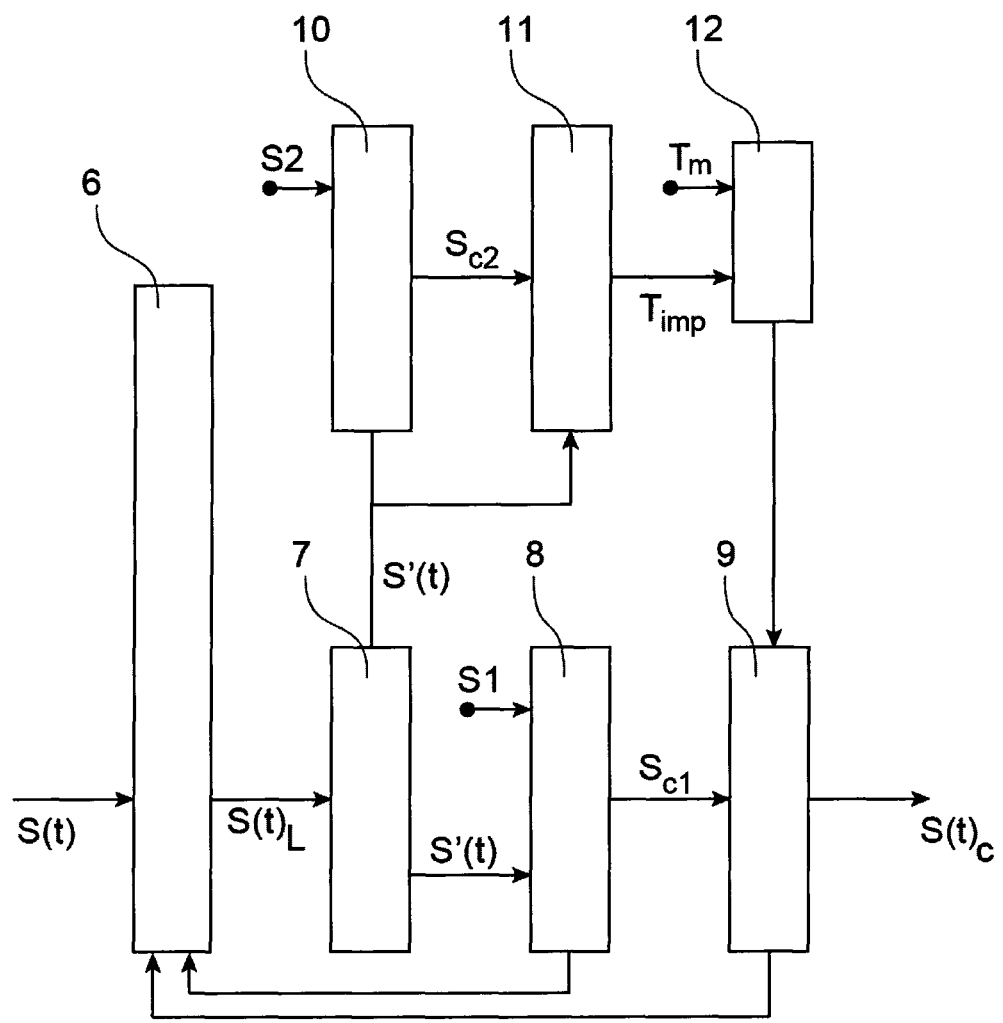
FIG. 15 shows an improvement of the circuit shown in FIG. 12.

According to the preferred embodiment of the invention, the device comprises, other than the set of elements mentioned in reference to the prior art circuit shown in FIG. 9 (detector 1, charge preamplifier 2, subtraction circuit 3, analog digital converter 4), a processing circuit 5, which performs processing of the digital signals S(t) delivered by the analog/digital converter ADC. FIG. 12 explicitly shows the processing units of the circuit 5 that operate in the context of the invention. FIG. 15 shows an improvement of the circuit shown in FIG. 12. The processing circuit 5 can be, for example, a microprocessor, a programmable logic circuit (FPGA for "Field Programmable Gate Array"), or a specific integrated circuit (ASIC circuit for "Application Specific Integrated Circuit".

The processing circuit 5 makes it possible to select certain digital signals, the selected digital signals then being intended to be processed by standard equipment positioned downstream of said circuit. This standard equipment can, for example, comprise a means making it possible to produce an amplitude spectrum of the captured digital signals. Such a spectrum corresponds to a histogram of the captured signals, as a function of their amplitude. Such a spectrometry means can for example comprise a multi-channel analyzer. Only the captured signals are considered by the multi-channel analyzer situated downstream of the capture circuit. In other words, the processing signal sorts the digital signals, only the so-called captured signals then being processed by the spectrometry means.

Signal capture refers to the transmission of the signal towards the electronic means positioned downstream of the capture circuit, the non-captured signals not being transmitted towards said means.

The charge preamplifier 2 and the subtraction circuit 3 make up a circuit called "first circuit" in the present patent application.

According to the preferred embodiment of the invention, the first circuit (2, 3) that delivers an analog pulse uses a delay line and a subtractor, which advantageously makes it possible to obtain a pulse whereof the temporal characteristics (rise time, decay time) are close to the pulse collected by the electrode of the detector. The use of a delay line circuit thus makes it possible to obtain precise temporal information.

The subtractor circuit 3 is placed between the output of the charge preamplifier 2 and the analog digital converter 4. This circuit makes it possible to perform a subtraction between:

the analog signal V(t) delivered by the preamplifier at the moment t, and an analog signal V'(t), delivered by a delay line circuit at the same moment, and depending on the analog signal V(t−Δt).

Thus, the signal V'(t) is an image of the signal V(t−Δt), Δt corresponding to the temporal offset produced by the delay line. For example, it is possible to have:

$$V'(t)=V(t-\Delta t)$$

or, more generally:

$$V'(t)=aV(t-\Delta t),$$

a being a real number.

The delay line circuit can comprise an attenuator, such that:

$$V'(t)\leq V(t-\Delta t)$$

Thus, the subtraction circuit 3 makes it possible to obtain an output signal E(t) such that:

$$E(t)=V(t)-V'(t),$$

whereof the temporal characteristics are close to those of the pulse detected at the terminals of the detector. In a manner known by those skilled in the art, the temporal offset Δt is chosen to be greater than or equal to the rise time of the pulse V(t) generated by the preamplifier. Thus, during detection of an interaction by the detector, i.e. when the detector generates a pulse, the signal E(t) generated by the subtraction circuit 3 describes a pulse whereof the amplitude is proportional to the amplitude of the detecting current, as can be seen in the aforementioned application EP 2 071 722.

It may also be possible to position the subtraction circuit 3 downstream of the analog digital converter 4, but then, still upstream of a capture unit 9 that will be described later. This then requires analog digital converters with a high dynamic (preferably greater than 8 bits, or even greater than 12 bits), with a sampling frequency in the vicinity of 100 MHz.

The invention also concerns other types of "first circuit" able to deliver an analog pulse whereof the amplitude is proportional to the amplitude produced at the terminals of the detector, for example an impulse filter such as that previously described. As in the prior art, this analog pulse is then digitized by an analog digital converter ADC, so as to produce a set of digitized signals, also called digital signals, S(t), assuming the form of a digitized pulse. Thus, a digitized pulse brings together the set of digital signals S(t) produced by the processing of the analog pulse by the analog digital converter, the analog pulse corresponding to an interaction detected by the detector.

FIG. 12 shows the units making up the processing circuit 5. The processing circuit 5 comprises a reading unit 6 for reading the digitized signal S(t) delivered by the analog/digital converter ADC, a unit 7 for computing the temporal variation rate S'(t) between two successive read digital signals, a comparison unit 8 for comparing the temporal variation rate S'(t) delivered by the unit 7 with a predetermined variation threshold S1 and a capture unit 9 able to capture or not capture the read digital signal.

The reading unit 6 reads, according to a reading frequency, the digitized signal S(t) delivered by the analog/digital converter ADC. Preferably, the reading frequency is also the sampling frequency of the analog digital converter and the reading unit and the analog digital converter are synchronized by the same clock. Unlike the device disclosed in document EP 2 071 722, the sampling frequency of the analog digital converter is fixed, which allows the use of a converter synchronized according to a high sampling frequency and that is particularly useful at high counting rates. Preferably, a pipeline converter, well known by those skilled in the art, will be used. In document EP 2 071 722, the sampling frequency is not constant: the sampling moments are determined by a module of the circuit, which requires the use of asynchronous converters, known for their lower sampling rate, such converters then being less adapted to high counting rates.

FIG. 13 shows an example of a digital signal delivered by an analog/digital converter ADC during detection of two successive interactions, corresponding to the two digitized signal pulses visible in this figure. The signal delivered by the analog/digital converter ADC is continuously digitized, for example at a high frequency between 1 MHz and 1 GHz (typically several hundred MHz). The time τ1 indicated on the first digitized signal pulse of FIG. 13 corresponds to the rise time of the current pulse collected by the electrode of the detector (transit time of the charges in the detector) and the time τ2 corresponds to the duration between the beginning of this current pulse and its decay (τ2 can thus correspond, in a first approximation, to the dead time of the spectrometry system used: this is a delay imposed by the delay line previously mentioned). The reading unit 6 delivers a read digital signal $S(t)_L$. The unit 7 for computing the temporal variation rate then determines the variation rate S'(t) in the form of equation (1) below:

$$S'(t)=[S(t)_L-S(t-dt)_L]/dt \qquad (1)$$

Thus, a variation rate S'(t) can be computed upon each new read pulse $S(t)_L$, i.e. the reading frequency.

FIG. 14 illustrates, as an example, the digital signal delivered by the unit for computing the temporal variation when the digital signal delivered by the converter ADC is in line with the signal shown in FIG. 13. The variation rate S'(t) delivered by the unit 7 is compared to the threshold S1 by the comparison unit 8. Upon each digitized signal pulse, the signal S'(t) successively assumes positive and negative values. The threshold S1 is placed at a predetermined negative value. The absolute value of the threshold S1 is greater than the noise level BS'(t) affecting the variation rate S'(t). Indeed, although it is not shown in the figures, the values of the variation rate S'(t) are affected by high frequency fluctuations due to the noise $BS(t)_L$ affecting the read digital signal $S(t)_L$. The noise BS'(t) affecting the signal S'(t) is generally of average value zero. The threshold S1 is then determined as a function of this noise BS'(t), such that S1 is less than the negative maximum amplitude of the noise BS'(t). Moreover, S1 will be chosen such that its absolute value is low enough, so that at the moment $t_0$ at which S'($t_0$) crosses the threshold S1, the digital signal $S(t_0)_L$ is as close as possible to the maximum value of the pulse, so that the captured value represents the maximum amplitude of said pulse. <<Close>> refers to several reading periods, a reading period dt corresponding to the inverse of the reading frequency.

The adjustment step of the threshold S1 is done experimentally and can be renewed, such that the threshold value S1 can be refreshed.

According to this embodiment, a detected interaction corresponds to positive values of $S(t)_L$, forming a pulse. In this case, the capture moment $t_0$ corresponds to the moment or:

$$S'(t0)\leq S1, \text{ with } S'(t_0-\delta t)>S1.$$

In other words, the variation rate S'(t) is a decreasing function when the signal S'(t) crosses S1.

The comparison signal $S_{c1}$ delivered by the comparison unit 8 controls the capture unit 9. If the threshold S1 is not crossed (i.e. S1≤S'(t)), the comparison signal orders the capture unit 9 not to capture the last read digitized signal. Otherwise (threshold crossed, i.e. S'(t)≤S1), the comparison signal orders the capture unit 9 to capture the last read digitized signal.

We see that for a same digitized signal pulse, corresponding to the signals S(t) from the digitization of a same analog pulse, the variation rate S'(t) successively describes a first part, corresponding to the amplitude growth of the signals S(t)$_L$, then a second part, corresponding to the amplitude decay of the signals S(t)$_L$. In the present case, the first part is called positive part and the second part is called negative part. The positive part of the signal S'(t) corresponds to the image of the photonic current produced by the interaction of a photon in the detector. The negative part of the signal S'(t) is used for the synchronization: once this negative part is below the threshold S1, the corresponding value of the signal S(t) is retained, or captured, for the formation of the spectrum. Advantageously, the device according to the invention has a better discrimination of the coincident interactions than the discrimination obtained by the circuits of the prior art. Working on the temporal variation of the signal present downstream of the delay line has an advantage in relation to working on the temporal variation of the signal present upstream of said line. Indeed, one then benefits from the filtering effect of the delay line, the signal to noise ratio of the signal present as output of the delay line being better than that existing as input of the line. The temporal information obtained is more precise. Moreover, in relation to the device described in patent EP 2 071 022, other than the aforementioned advantage, the device according to the invention requires fewer components, which makes it simpler and more economical to produce.

FIG. 15 shows an improvement of the circuit shown in FIG. 12. According to this improvement, the device comprises means able to determine a duration of the positive part of the signal S'(t). Indeed, when S'(t) reaches the value S1 corresponding to the capture moment t$_0$ previously described, but the positive part of S'(t) exceeds a predetermined duration T$_m$, the capture is not done. Positive part of S'(t) refers to the set of signals S'(t), corresponding to the amplitude growth of the signals S(t)$_L$ corresponding to the same digitized analog pulse.

Other than the previously mentioned circuits 6, 7, 8, and 9, the circuit 5 comprises a comparison unit 10 for comparing the signal, a counting unit 11 for counting the duration T$_{imp}$ of the positive part of S'(t) and a comparison unit 12 of said duration T$_{imp}$. The signal S'(t) is first compared with a threshold value S2. The threshold value S2 is adjusted experimentally, as a function of the noise BS'(t) affecting the signal S'(t). S2 is set such that its value has a sign opposite S1 and its absolute value is greater than the maximum amplitude of the noise BS'(t). It can have a value opposite S1, i.e. the same absolute value, but opposite sign. When the signal S'(t) is greater than S2, the comparison unit 10 delivers a signal S$_{c2}$ that orders the counting of the pulse duration T$_{imp}$, otherwise there is no counting. There is an incrementation of the pulse duration counter for each read value of S'(t) until a read signal S'(t) becomes less than S2 again, which stops the counting. The duration T$_{imp}$ of the positive part of the pulse S'(t) delivered by the counting unit 11 is then compared to a threshold value of duration T$_m$. The duration T$_m$ is preferably chosen as being the rise time of the output signal of the charge preamplifier. If the duration T$_{imp}$ of the positive part of the pulse S'(t) is greater than T$_m$, the signal delivered by the comparison unit 12 orders the capture unit 9 not to capture the signal S(t$_0$)$_L$, corresponding to the moment t$_0$ at which S'(t) passes below the threshold S1 as previously described. If the pulse duration T$_{imp}$ is less than or equal to T$_m$, the signal S(t$_0$)$_L$ corresponding to the moment t$_0$ such that S'(t$_0$)≤S1 and S'(t0−δt)>S1, δt being the period of the synchronization clock of the reading circuit, is taken into account.

Until now we have examined the case where a detected interaction produces a positive pulse of the digitized signal, i.e. the signals S$_L$ read during the interaction are positive. Naturally, it will be understood that the invention previously described is also applicable if an interaction produces a negative pulse of the digitized and read signal, i.e. during the interaction, the signals S(t)$_L$ are negative, the threshold S1 will be positive, and the capture will be done at the moment t$_o$ where S'(t$_o$) crosses the threshold S1 while increasing. In other words, the capture moment t$_0$ is such that S'(t$_o$)≥S1 and S'(t$_0$−dt)<S1. Still according to this case, the threshold S2 will be negative.

The device according to the invention, when it is positioned upstream of spectrometry means, such as those previously mentioned, advantageously allows spectrometric measurements under high flow. The device according to the invention in fact makes it possible to extract the values used to construct the spectrum even in the presence of many pile-ups of pulses shaped by the delay line.

FIGS. 16A and 16B illustrate this advantage of the invention. FIG. 16A shows voltage pulses obtained in the presence of a number of pile-ons and FIG. 16B shows the temporal variations of the voltage pile-ons shown in FIG. 16A. The crossing of the threshold S1 by the temporal signal variations (cf. FIG. 16B) provides a temporal reference to trigger saving in the spectrum of the signal. Once the temporal variation is below the threshold S1 (cf. FIG. 16B), the corresponding value of the signal (cf. FIG. 16A) is picked up and saved for building the spectrum. Contrary to the methods of the prior art, it is then still possible to extract correct measurements, even in case of superposition of the pulses. The device according to the invention thus makes it possible to push the performance of the pulse shaping systems to their maximum counting rate performance.

FIGS. 17A and 17B illustrate the advantages resulting from the improvement of the device of the invention shown in FIG. 15. In the case where the duration of the positive part of the temporal variation of the signal is longer than the reference time T$_m$, there is a pile-on. The value of the detected energy is then wrong and it must not be shown in the energy spectrum. FIGS. 17A and 17B illustrate the case where two photons interact in the detector in a very short time. The temporal variation of the signal then does not cross the threshold S1 and the duration of the positive part of the temporal variation is greater than T$_m$. The two photons are therefore not retained for the spectrum. The dead time of the delay line device of the invention is the time necessary to measure the energy of a photon that interacts in the detector, i.e. the delay T$_d$ imposed by the delay line. One condition that must be respected in the device of the invention is then that the delay T$_d$ is greater than or equal to the duration T$_m$.

The device as described in the invention will find applications requiring conducting of a measurement by spectrometry of any ionizing radiation, and particularly X radiation or gamma radiation, and in particular in the cases where said radiation is intense.

Aside from checking baggage, this device can be applied in the nuclear field, for example measuring waste or fuel.

The invention claimed is:
1. A device for processing a signal delivered by a radiation detector, the device comprising:
   a first circuit to deliver a voltage pulse, an amplitude of the voltage pulse being proportional to a charge detected by the detector;
   an analog/digital converter to digitize the voltage pulse at a given sampling frequency and to deliver a digital signal; and
   a processing circuit connected to an output of the analog/digital converter, the processing circuit including a reading unit to read the digital signal delivered by the analog/digital converter, a computing unit to compute a temporal variation rate of the read digital signal, the temporal variation rate being a bipolar signal, and a capture circuit, controlled by said computing unit, to capture the read digital signals when the temporal variation rate reaches a predetermined threshold.

2. The device according to claim 1, comprising, downstream of the processing circuit (5), a spectrometry unit to obtain an amplitude spectrum of the captured signals.

3. The device according to claim 1, wherein the processing circuit also comprises a counter to determine a duration during which the temporal variation rate is above an amplitude threshold having a sign opposite the predetermined threshold, and a comparator to compare said duration with a duration threshold value, the comparator delivering a signal that conditions the capture of the read digital pulse such that a read digital pulse is captured if the duration during which the temporal variation rate is greater than the amplitude threshold is less than or equal to the duration threshold value.

4. The device according to claim 3, wherein the counter is incremented upon each read digital signal, the counter being interrupted once a read digital pulse has an amplitude below the amplitude threshold.

5. The device according to claim 3, wherein the duration threshold value is a rise time of an output signal of a charge preamplifier placed at an input of the device.

6. The device according to claim 1, wherein the first circuit includes an energy measurement circuit with a delay.

7. The device according to claim 1, wherein the given sampling frequency of the analog/digital converter is greater than 100 KHz.

8. The device according to claim 1, wherein the processing circuit is a microprocessor, or a programmable logic circuit, or a specific integrated circuit.

9. A radiation detection system comprising a detector and a device to process a signal delivered by the detector according to any one of claims 1 to 7.

10. The radiation detection system according to claim 9, wherein the detector is a semiconductor detector.

11. The radiation detection system according to claim 10, wherein the semiconductor is chosen among CdZnTe, CdTe:Cl, CdTe:In.

12. A device to process a signal received by a radiation detector, comprising:

a preamplifier, to generate an output signal when an interaction is detected by the radiation detector;

an analog/digital converter to digitize said output signal at a predetermined sampling frequency and to deliver a digital signal;

a first circuit, connected downstream of the analog/digital converter, to deliver a voltage pulse, an amplitude of which is proportional to a charge detected by the detector;

a processing circuit, connected downstream of the analog/digital converter and the first circuit, the processing circuit including a reading unit to read the digital signal delivered by the analog/digital converter, a computing unit to compute a temporal variation rate of the digital signal read by the reading unit, the temporal variation being a bipolar signal; and a capture circuit, controlled by said computing unit, to capture the digital signal read by the reading unit when the temporal variation rate reaches a predetermined threshold.

13. The device according to claim 12, further comprising:

a spectrometry unit to obtain an amplitude spectrum of the digital signal captured by the capture circuit, the spectrometry unit being downstream of the processing circuit.

14. The device according to claim 12, wherein the processing circuit also comprises a counter to determine a duration during which the temporal variation rate is above an amplitude threshold having a sign opposite the predetermined threshold, and a comparator to compare said duration with a duration threshold value, the comparator delivering a signal that conditions the capture of the read digital pulse such that a read digital pulse is captured if the duration during which the temporal variation rate is greater than the amplitude threshold is less than or equal to the duration threshold value.

15. The device according to claim 14, wherein the counter is incremented upon each read digital signal, the counter being interrupted once a read digital pulse has an amplitude below the amplitude threshold.

16. The device according to claim 12, wherein the first circuit includes an energy measurement circuit with a delay.

* * * * *